(12) United States Patent
Orlowski

(10) Patent No.: US 7,442,590 B2
(45) Date of Patent: Oct. 28, 2008

(54) METHOD FOR FORMING A SEMICONDUCTOR DEVICE HAVING A FIN AND STRUCTURE THEREOF

(75) Inventor: Marius K. Orlowski, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 264 days.

(21) Appl. No.: 11/380,530

(22) Filed: Apr. 27, 2006

(65) Prior Publication Data
US 2007/0254435 A1   Nov. 1, 2007

(51) Int. Cl.
*H01L 21/00* (2006.01)
*H01L 29/80* (2006.01)

(52) U.S. Cl. .................. 438/157; 257/270
(58) Field of Classification Search ............ 438/157, 438/176, 195, 283, 196; 257/270, 327
See application file for complete search history.

(56) References Cited

U.S. PATENT DOCUMENTS

| | | | |
|---|---|---|---|
| 6,855,582 B1 * | 2/2005 | Dakshina-Murthy et al. | 438/157 |
| 6,855,989 B1 * | 2/2005 | Wang et al. | 257/349 |
| 6,936,516 B1 | 8/2005 | Goo et al. | |
| 6,951,783 B2 | 10/2005 | Mathew et al. | |

OTHER PUBLICATIONS

Doris, B. et al.; "Ultra-Thin SOI Replacement Gate CMOS with ALD TaN / High-k Gate Stack"; VLSI Technical Symposium; 2005; pp. 101-102; IEEE.
Mathew, L. et al.; "Multiple Independent Gate Field Effect Transistor (MIGFET)—Multi Fin RF Mixer Architecture, Three Independent Gates (MIGFET-T) Operations and Temperature Characteristics"; 2005 Symposium on VLSI Technology 2005 Digest of Technical Papers; Jun. 14-16, 2005; pp. 200-201.
Chang, C.P. et al.; "SALVO Process for Sub-50 nm Low-VT Replacement Gate CMOS with KrF Lithography"; IEDM; 2000; pp. 53-56.
U.S. Appl. No. 11/339,953, filed Jan. 26, 2006.

* cited by examiner

*Primary Examiner*—Calvin Lee
(74) *Attorney, Agent, or Firm*—Joanna G. Chiu; Kim-Marie Vo

(57) ABSTRACT

A method for forming a semiconductor device includes providing a semiconductor layer, forming a passivation layer over the semiconductor layer, wherein the passivation layer has an opening having sidewalls, forming a fin over the semiconductor layer, wherein after forming the passivation layer the fin is within the opening, and forming a portion of a gate within the opening. In one embodiment, a dummy gate is used. In one embodiment, spacers are formed within the opening of the passivation layer. The structure is also discussed.

15 Claims, 8 Drawing Sheets

METHOD FOR FORMING A SEMICONDUCTOR DEVICE HAVING A FIN AND STRUCTURE THEREOF

FIELD OF THE INVENTION

This invention relates generally to semiconductor processing, and more specifically, to forming a semiconductor device having a fin.

RELATED ART

Typically, double gated transistors are desirable because they allow for tighter electrostatic control over the channel so that, for example, smaller dimensions can be achieved. One type of double gated transistor that is currently known is a Fin Field Effect Transistor (FinFET). FinFETs form gate electrodes over one or more fins, where the regions of the fins that are adjacent the gate electrodes form the channel regions of the devices. However, as these devices are scaled, mechanical stability is reduced. For example, wrapping thin and tall gate electrodes around high aspect fins may result in mechanically unstable gate electrodes. This problem is exacerbated as technology improves and gate lengths continue to scale.

BRIEF DESCRIPTION OF THE DRAWINGS

The present invention is illustrated by way of example and is not limited by the accompanying figures, in which like references indicate similar elements.

Figure 1:
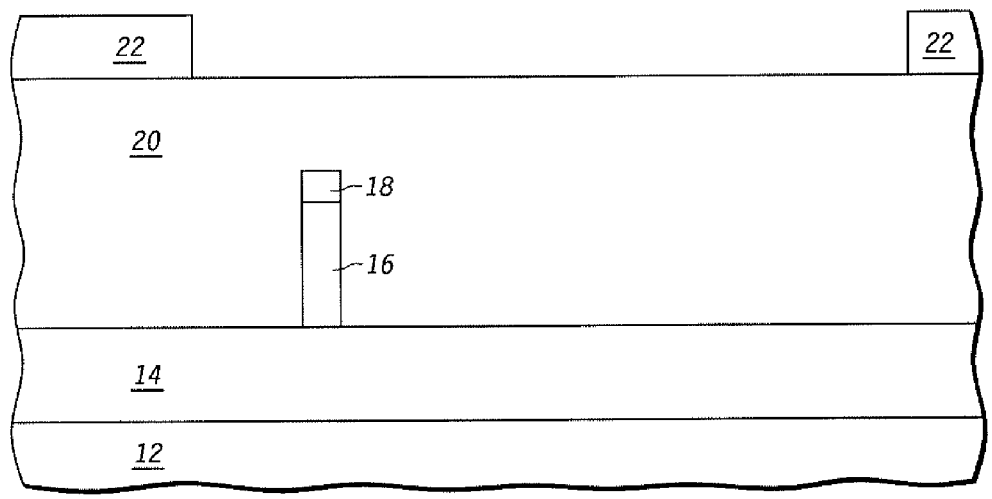
FIGS. 1-8 illustrates cross sectional views at various points in processing a FinFET device in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As discussed above, as device dimensions are continually scaled, gate electrodes of FinFET transistors become increasingly mechanically unstable. Therefore, in one embodiment, a FinFET is formed in which spacers are used to increase mechanical stability while allowing for smaller gate dimensions. In one embodiment, spacers are formed prior to the formation of the gate electrode which may allow for improved mechanical stability and which may also be used to achieve smaller, sublithographic, dimensions.

In one embodiment, a method for forming a semiconductor device includes providing a semiconductor layer, forming a passivation layer over the semiconductor layer, wherein the passivation layer has an opening having sidewalls, forming a fin over the semiconductor layer, wherein after forming the passivation layer the fin is within the opening, and forming a portion of a gate within the opening.

In a further embodiment, the fin is formed before forming the passivation layer.

In another further embodiment, the method includes forming spacers along the sidewalls of the opening. In yet a further embodiment, the method includes forming a dummy gate over the fin, and removing the dummy gate before forming the spacers, where forming the gate is performed after removing the dummy gate. In yet a further embodiment, forming the gate further includes forming a gate electrode and a gate contact area and forming dummy gate further includes forming a dummy structure for the gate electrode. In yet another further embodiment, forming the spacers includes depositing a dielectric layer within the opening and over the fin, and anisotropically etching the dielectric layer to remove all portions of the dielectric layer except some portions that are adjacent the passivation layer to form the spacers, wherein the spacers have a first height and the opening of the passivation layer as a second height, wherein the first height is less than the second height. In yet a further embodiment, the method further includes providing a buried oxide layer over the semiconductor layer, forming a capping layer over the fin, and forming a gate dielectric layer within the opening and over the fin, where forming the fin further includes forming the fin over the buried oxide layer, and forming the gate further includes forming the gate over the gate dielectric layer. In yet another further embodiment, forming a portion of the gate within the opening further includes forming the portion of the gate so that the portion of the gate has a top portion and a bottom portion, where the top portion is substantially contiguous with a top of the passivation layer and has a first dimension, the bottom portion is adjacent the spacers and has a second dimension between the spacers, the second dimension is parallel to the first dimension, and the first dimension is greater than the second dimension.

In another further embodiment, forming the passivation layer further includes depositing a passivation layer, forming a masking layer over the passivation layer, wherein the masking layer has a pattern, and etching the passivation layer using the masking layer to form the opening in the passivation layer.

In another further embodiment, forming the fin further includes forming the fin with a first height, and forming the passivation layer further includes forming the passivation layer with a second height, where the second height is greater than the first height.

In another embodiment, a method of forming a semiconductor device includes forming a semiconductor layer; forming a passivation layer over the semiconductor layer, wherein the passivation layer has an opening and wherein the opening has sidewalls; forming a fin over the semiconductor layer, where after forming the passivation layer the fin is within the opening of the passivation layer; forming a spacer adjacent the sidewalls of the opening of the passivation; and forming a gate, where a portion of the gate is within the opening of the passivation layer.

In a further embodiment, fin is formed before forming the passivation layer.

In another further embodiment, forming the gate further includes forming a gate electrode and a gate contact area.

In another further embodiment, forming the spacer further includes depositing a dielectric layer within the opening of the passivation layer and over the fin, and anisotropically etching the dielectric layer to remove at least portions of the dielectric layer that are over the fin and at least portions of the dielectric layer that are adjacent the fin to form the spacer along the sidewalls of the opening of the passivation layer.

In another further embodiment, the method further includes forming a dummy gate over the fin, and removing the dummy gate before forming the spacer, where forming the gate is performed after removing the dummy gate.

In another further embodiment, forming the passivation layer further includes depositing a passivation layer, forming a masking layer over the passivation layer, where the masking layer has a pattern, and etching the passivation layer using the masking layer to form the opening of the passivation layer.

In another embodiment, a semiconductor device includes a semiconductor layer, a passivation layer over the semiconductor layer, where the passivation layer has an opening and the opening has sidewalls, a fin over the semiconductor layer and within the opening of the passivation layer, spacers adjacent the sidewalls of the opening of the passivation layer, and a gate, where a portion of the gate is within the opening of the passivation layer.

In a further embodiment, the portion of the gate within the space has top portion and a bottom portion, the top portion is substantially contiguous with a top of the passivation layer and has a first dimension, the bottom portion is adjacent the spacers and a second dimension between the spacers, the second dimension is parallel to the first dimension, and the first dimension is greater than the second dimension.

In another further embodiment, the fin has a first height, the passivation layer has a second height, and the second height is greater than the first height.

In another further embodiment, the gate includes a metal gate.

Figure 8:
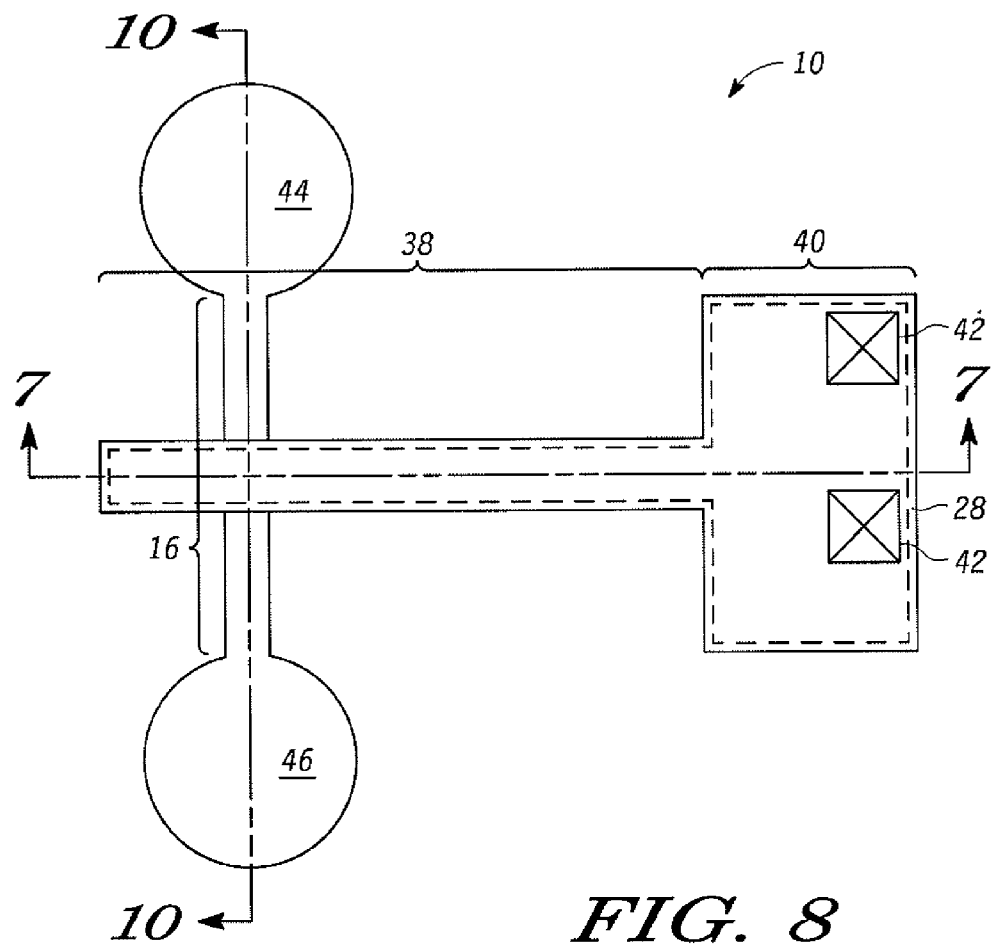

FIG. 8 illustrates a top down view of a FinFET semiconductor device which may be formed in accordance with various embodiments of the present invention. Device 10 includes a fin portion 16 having a first source/drain region 44 at one end and a second source/drain region 46 at an opposite end. A gate electrode 38 is formed over fin 16. Device 10 also includes a gate contact area 40 at one end of gate electrode 38. Gate contact area 40 includes gate contacts 42. Device 10 also includes a spacer 28 which underlies gate electrode 38 and gate contact area 40. The portion of fin 16 which underlies spacer 28 and gate electrode 38 forms the channel region of device 10. Note that gate electrode 38 and gate contact area 40 may be referred to as a gate of device 10.

The format of device 10 is exemplary and alternate embodiments may include any number of variations. For example, a gate contact area may be located at both ends of gate electrode 38. The shapes of source/drain regions 44 and 46 may also differ in different embodiments. Also, FIG. 8 illustrates only a single fin 16; however, alternate embodiments may include any number of fins where gate electrode 38 may therefore be formed over the fins. Also, any number of gate contacts may be formed. Although not illustrated, device 10 may also include any number of source/drain contacts which would contact source/drain regions 44 and 46. FIGS. 1-7 illustrate cross sectional view of various processing steps which may be used to form the device of FIG. 8.

FIG. 1 illustrates device 10 after formation of fin 16, passivation 20, and a patterned masking layer 22. Device 10 includes a layer 12 and an insulating layer 14 overlying layer 12. In one embodiment, layer 12 includes a semiconductor layer such as, for example, a silicon layer. However, in alternate embodiments, layer 12 can be formed of any material and may be used to provide support for insulating layer 14. In one embodiment, insulating layer 14 is an oxide. Insulating layer 14 may also be referred to as a buried oxide layer. Fin 16 is formed over insulating layer 14 and may include a semiconductor material, such as, for example, silicon or silicon germanium. In the illustrated embodiment, fin 16 also includes a capping layer 18 which may be, for example, a nitride. In one embodiment, fin 16 is formed using a semiconductor-on-insulator (SOI) wafer. In this embodiment, an SOI wafer is provided having a semiconductor layer overlying an insulating layer (such as insulating layer 14) which overlies a layer (such as layer 12). The semiconductor layer of the provided SOI can then be patterned to form one or more fins such as fin 16. If capping layer 18 is present, a layer can be formed over the SOI wafer prior to patterning the fin to result in capping layer 18 and fin 16. (Note that capping layer 18 may also be referred to as a cap.)

Passivation layer 20 is formed over insulating layer 14 and fin 16. In one embodiment, passivation layer 20 is deposited using, for example, tetraethylorthosilicate (TEOS). Patterned masking layer 22 is formed over passivation layer 20, where patterned masking layer defines an opening corresponding to gate electrode 38 and gate contact area 40. In one embodiment, patterned masking layer includes photoresist.

Figure 2:
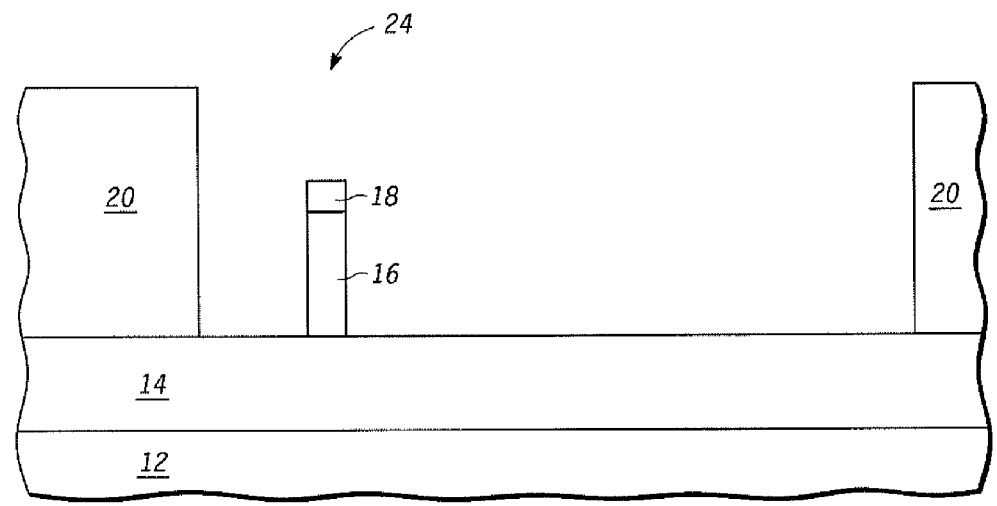

FIG. 2 illustrates device 10 after using patterned masking layer 22 to remove (for example, etch) portions of passivation layer 20 over fin 16 to form an opening 24. Opening 24 defines the location of at least a portion of the gate of device 10. For example, referring back to FIG. 8, opening 24 may define the location of gate electrode 38 and gate contact area 40. Note that opening 24 within passivation layer 20 is a cross-section of a cavity within passivation layer 20. Also, note that fin 16 is within opening 24. After forming opening 24 in passivation layer 20, patterned masking layer 22 is removed.

Figure 3:
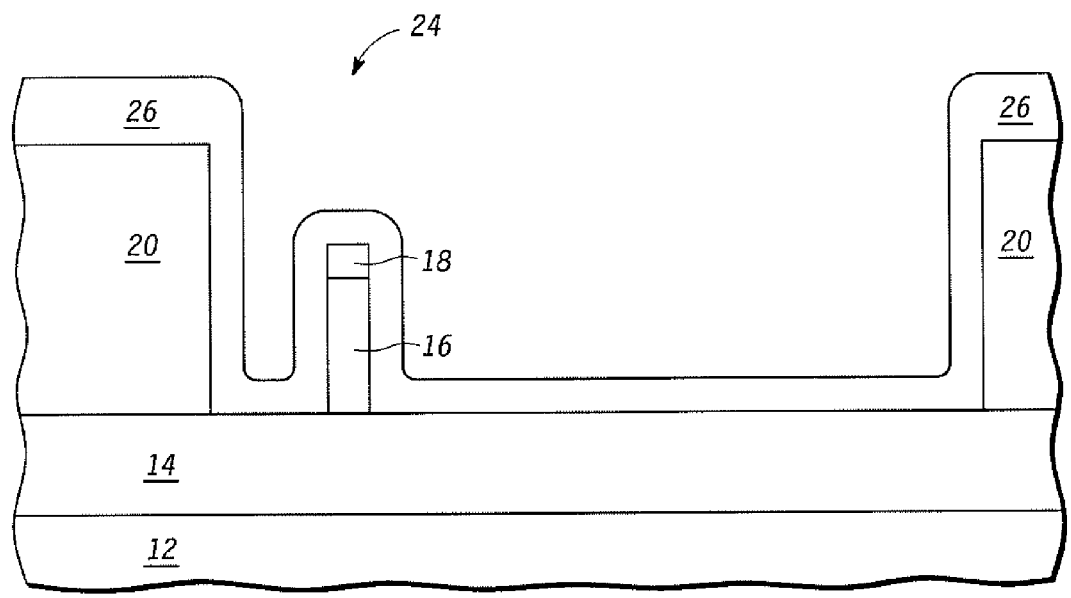

FIG. 3 illustrates device 10 after formation of a spacer layer 26 over passivation layer 20 and over insulating layer 14 and fin 16 (and capping layer 18, if present) within opening 24. Spacer layer 26 may be formed, for example, using a deposition process. In one embodiment, spacer layer 26 includes an oxide. Note that spacer layer 26 may include any suitable dielectric and may therefore also be referred to as a dielectric layer.

Figure 4:
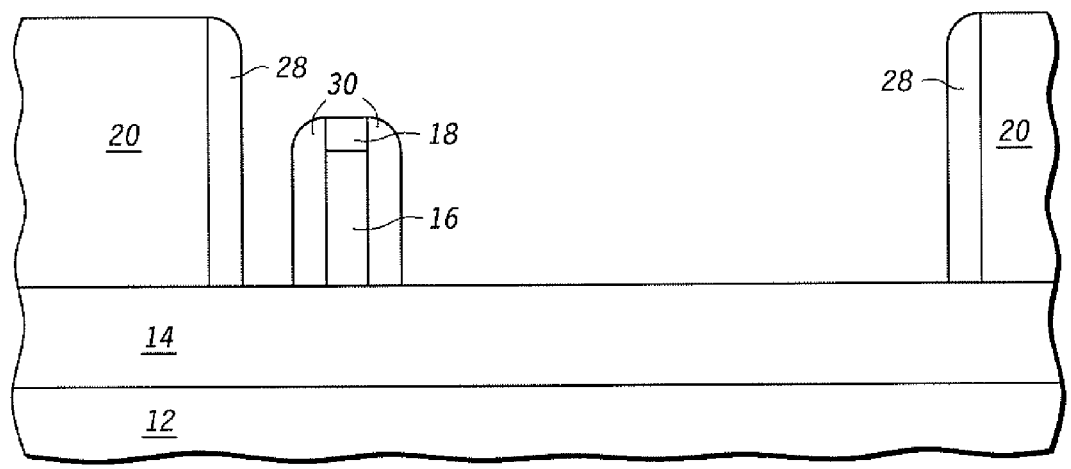
Figure 5:
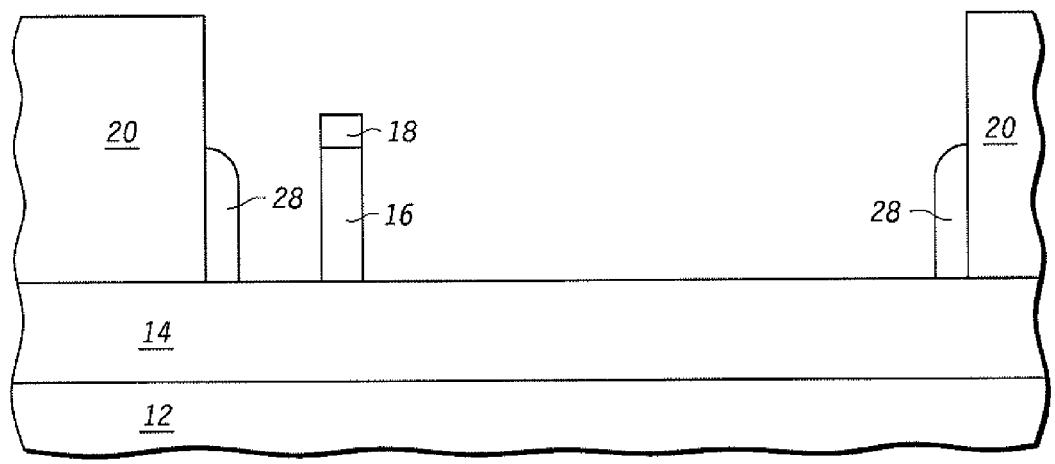

FIG. 4 illustrates device 10 during an intermediate stage of anisotropically etching spacer layer 26 to form spacers 28 adjacent sidewalls of passivation layer 20 and spacers 30 adjacent sidewalls of fin 16. The anisotropic etch is continued, as illustrated in FIG. 5, until spacers 30 are removed. However, since the height of passivation layer 20 is greater than the height of fin 16, portions of spacers 28 remain adjacent sidewalls of passivation layer 20. Therefore, note that a height of spacers 28 is less than the height of passivation layer 20. Spacers 28, as will be discussed further below, may be used to increase mechanical stability of device 10 and may also be used to achieve smaller gate lengths. (Note that although, in FIGS. 4 and 5, spacers 30 and 28 each appear to include separate portions due to the illustrated cross section, they may each be portions of a single spacer, as illustrated with respect to spacer 28 in the top down view of FIG. 8. Therefore, each of spacers 28 and 30 may also be referred to as spacer 28 and spacer 30, respectively.)

Figure 6:
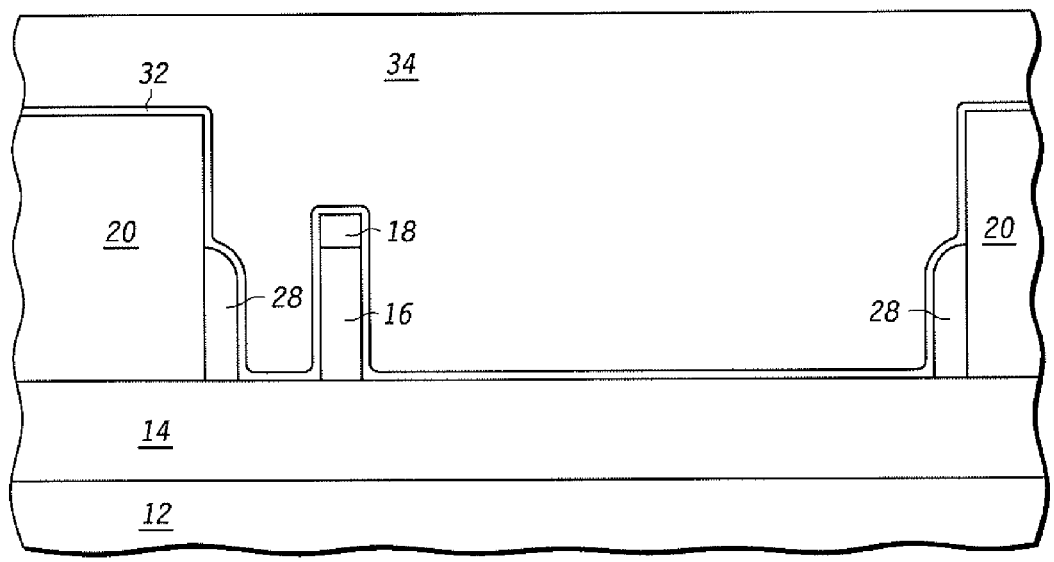

FIG. 6 illustrates device 10 after formation of a gate dielectric layer 32 over passivation layer 20, spacer 28, fin 16 (and capping layer 18, if present), and insulating layer 14. Gate dielectric layer 32 may include any type of gate dielectric material such as an oxide or metal oxide. Gate dielectric layer 32 may include a material having a dielectric constant (K) greater than that of silicon dioxide (which may therefore be referred to as a high K material), such as, for example, hafnium oxide. In one embodiment, gate dielectric 32 is deposited by chemical vapor deposition (CVD) or atomic layer deposition (ALD), as shown in FIG. 6. In an alternate embodiment, gate dielectric layer 32 may be grown on sidewalls of fin 16. In this embodiment, gate dielectric layer 32 may be, e.g., grown silicon dioxide or silicon oxynitride. Also, in this alternate embodiment, gate dielectric layer 32 would only be grown on sidewalls of fin 16.

A gate layer 34 is then formed over gate dielectric layer 32. Gate layer 34 may include any type of gate material or materials. For example, gate layer 34 may include silicon or may include a metal. Furthermore, gate layer 34 may include any number of different layers, where gate layer 34 may represent a gate stack layer.

Figure 7:
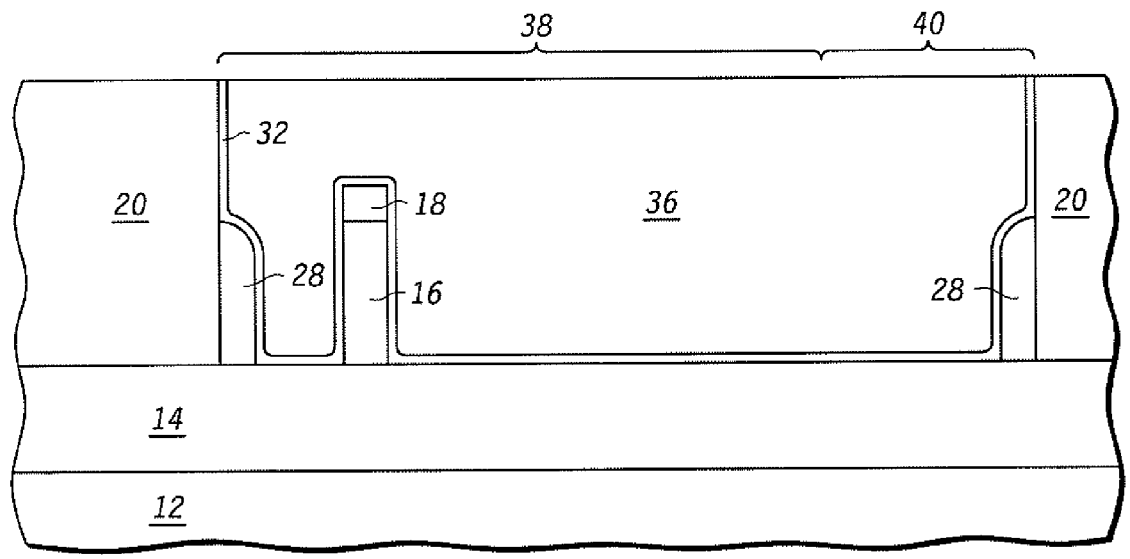

FIG. 7 illustrates device 10 after planarizing gate layer 34 to form gate 36. Gate 36 includes a gate electrode portion (gate electrode 38) and a gate contact portion (gate contact area 40). In one embodiment, after planarization, a top portion of gate 36 is substantially contiguous with a top of passivation layer 20. Therefore, note that FIG. 7 corresponds to a horizontal cross section taken through the top down view of device 10 of FIG. 8, which was described above.

Figure 9:
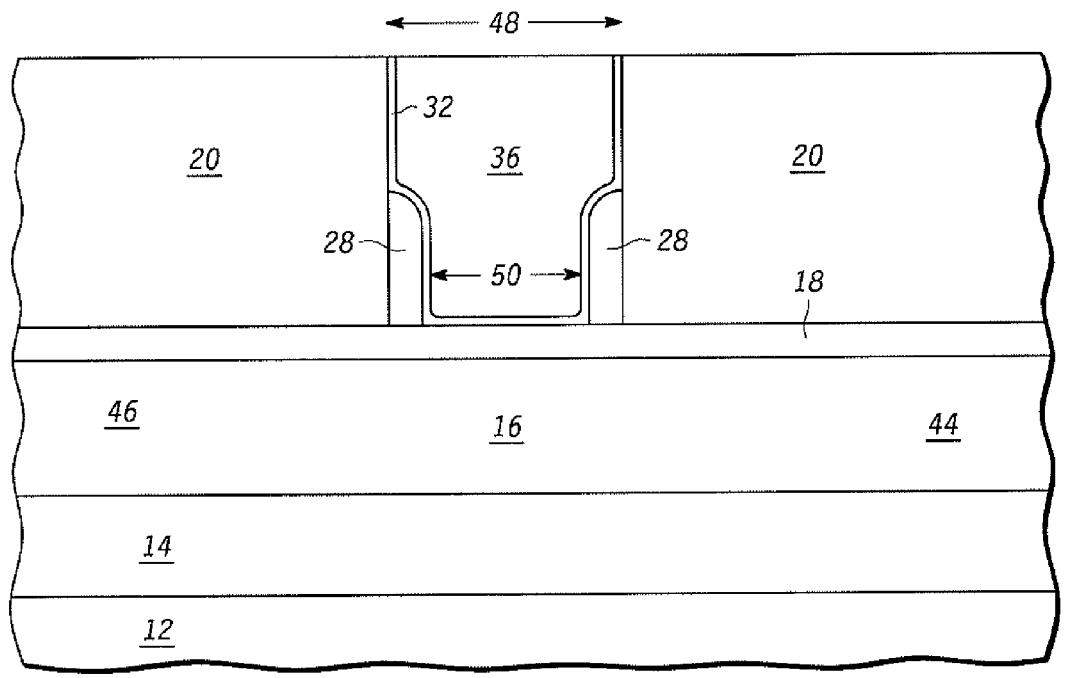
FIG. 9 illustrates a top down view of a FinFET in accordance with an embodiment of the present invention.

FIG. 9 illustrates a cross sectional view corresponding to a cross section taken through the middle of source/drain regions 44 and 46 and fin 16. The cross section is taken at the same location through the top down view of device 10 of FIG. 8 as the cross section of FIG. 10; however, in FIG. 9, passivation layer 20 is still present. Therefore, gate 36 and spacer 28 is shown overlying fin 16 (and capping layer 18, if present). Note that the portion of fin 16 underlying gate 36 in FIG. 9 includes a channel region of device 10. Also, note that dimension 48, which corresponds to the opening width defined by patterned masking layer 22, is greater than dimension 50 which corresponds to the actual gate length of device 10. Note that dimension 48 corresponds to a length of a top portion of gate 36 that is substantially contiguous with a top of passivation layer 20, and dimension 50 corresponds to a length of bottom portion of gate 36 that is adjacent spacers 28. Therefore, note that spacer 28 may be used to achieve gate lengths that are shorter than what may be available through the use of patterned masking layer 22 or other lithographic techniques.

Figure 10:
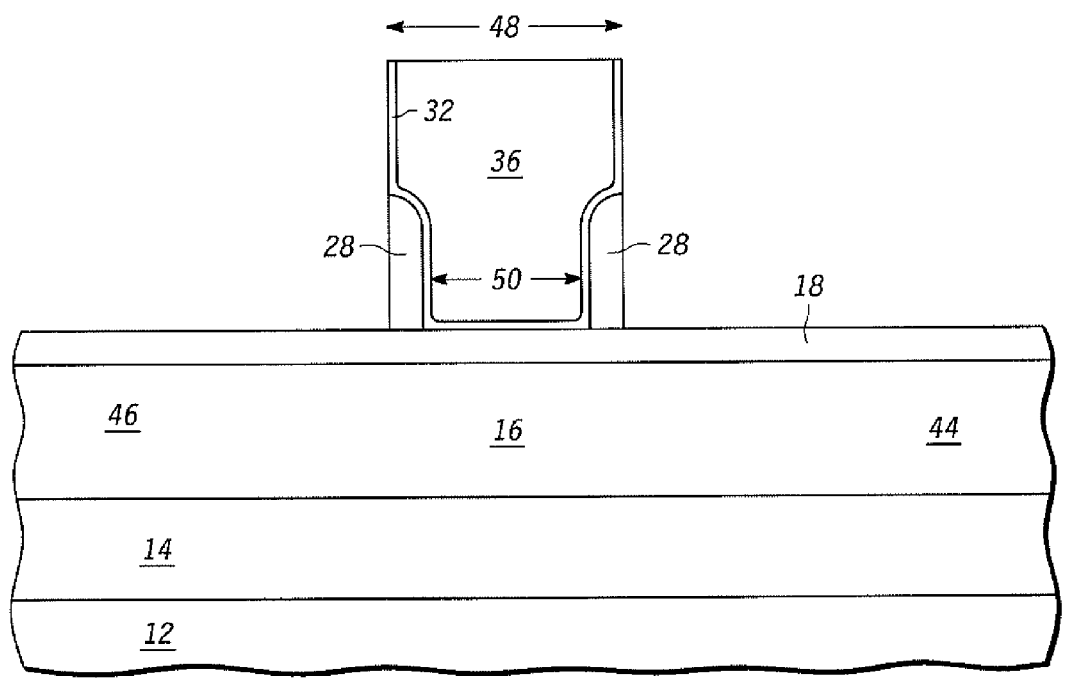
FIG. 10 illustrates a cross sectional view taken through the FinFET of FIG. 9.

FIG. 10, corresponding to a cross section taken through the top down view of FIG. 8, illustrates device 10 after removal of passivation layer 20. Note that spacer 28 remains along sides of gate 36. Therefore, spacer 28 may provide mechanical support to gate 36, thus allowing for a more mechanically stable device as compared to current FinFET devices. After removal of passivation layer 20, conventional processing may be used to substantially complete the FinFET device. For example, spacers may be formed along sidewalls of gate 36 and spacer 28 using conventional processing techniques. Also, conventional implants may be used to form source/drain regions 44 and 46.

Figure 11:
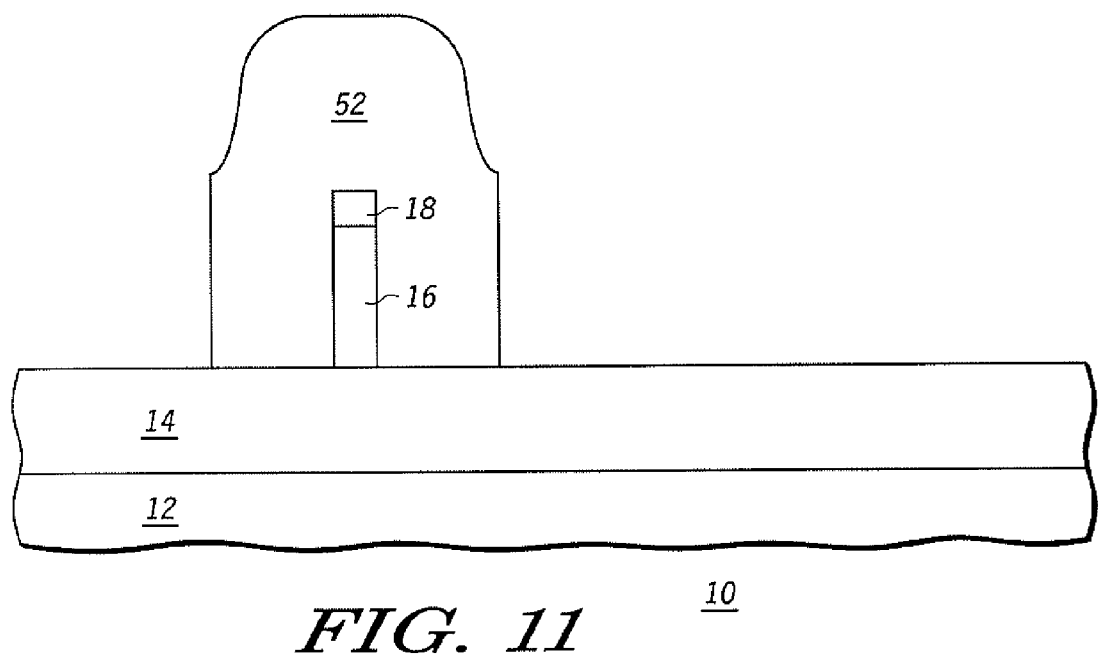
FIGS. 11-16 illustrate cross sectional views at various points in processing a FinFET device in accordance with an alternate embodiment of the present invention.

FIGS. 11-16 illustrate cross sectional views of device 10 which is formed in accordance with an alternate embodiment of the present invention and also results in device 10 of FIG. 8. FIG. 11 illustrates layer 12, insulating layer 14, fin 16, and capping layer 18, all of which were described above in reference to FIG. 1. After formation of fin 16 and capping layer 18, a patterned dummy gate layer 52 is formed over fin 16 and capping layer 18. Since dummy gate layer 52 will be later removed, it may be formed of any suitable easily removable material. In one embodiment, source/drain implants may be formed after forming dummy gate layer 52. In this manner, dummy gate layer 52 may protect fin 16 during the implants. Dummy gate layer 52 may be considered a dummy structure for at least a portion of the subsequently formed gate electrode 38.

Figure 12:
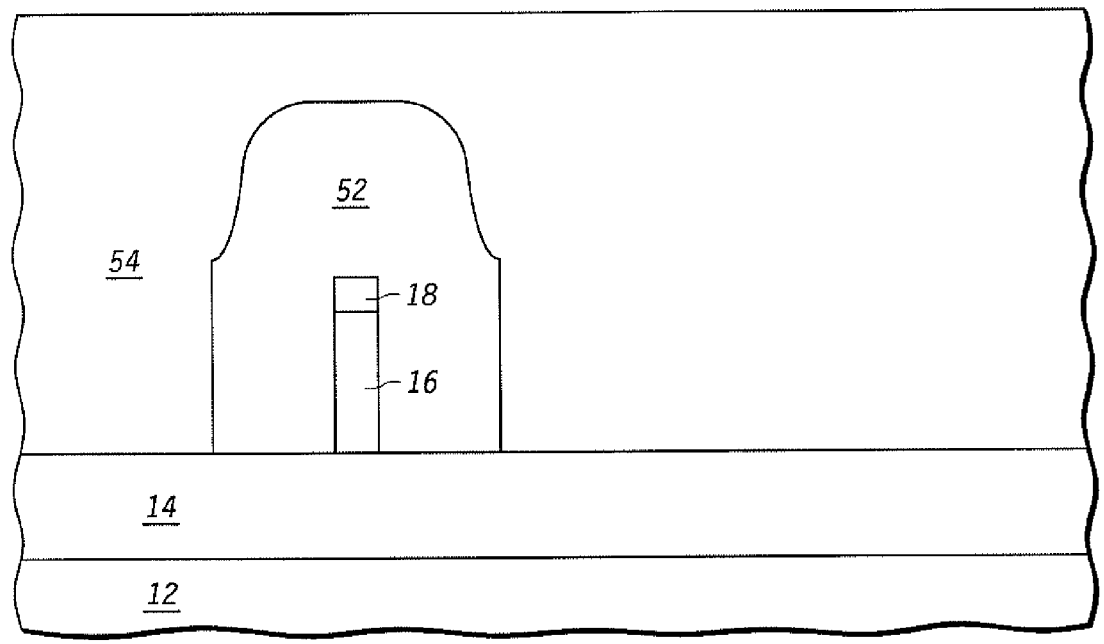

FIG. 12 illustrates device 10 after formation of a passivation layer 54 over dummy gate layer 52. Passivation layer 54 is analogous to passivation layer 20 and may be formed using the same processes and materials.

Figure 13:
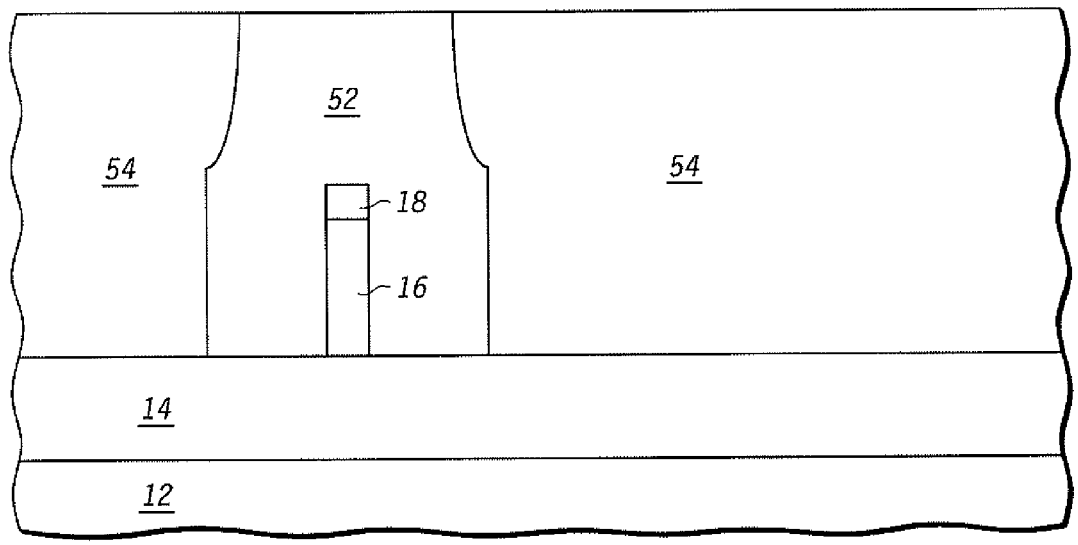

FIG. 13 illustrates device 10 after planarization of passivation layer 54 to expose a top portion of dummy gate layer 52.

Figure 14:
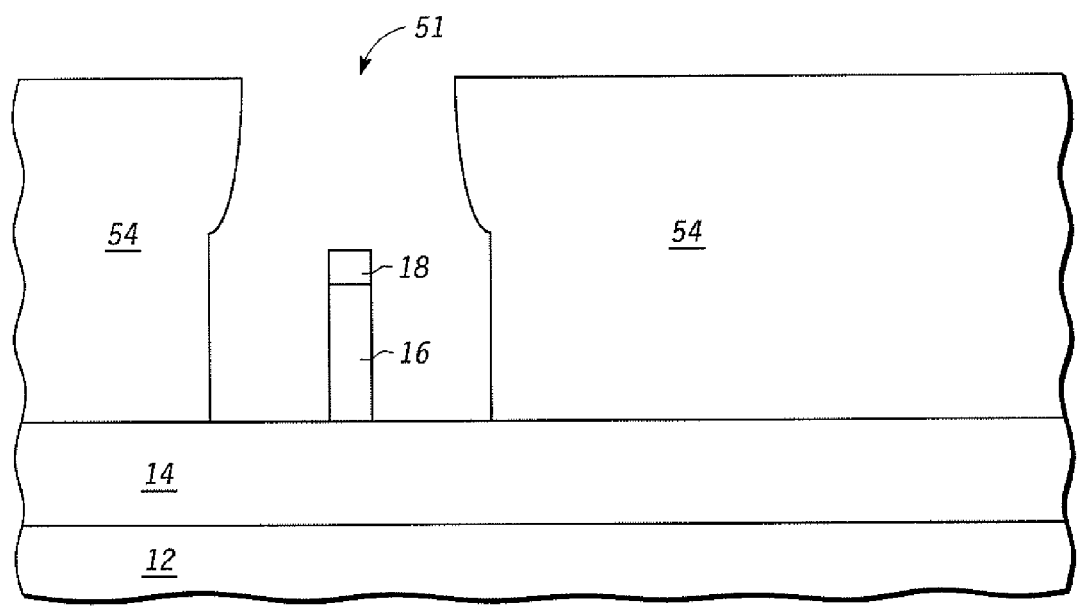

FIG. 14 illustrates device 10 after removal of dummy gate layer 52. Note that fin 16 and capping layer 18 remain. Therefore, the removal of dummy gate layer 52 results in an opening 51 within passivation layer 54 in which fin 16 is located. That is, note that opening 51 in passivation layer 54 is a cross-section of a cavity within passivation layer 54. Note that opening 51 is similar to opening 24 described above. However, while opening 24 defines the location of gate electrode 38 and gate contact area 44, opening 51 defines the location of a portion of the gate overlying fin 16.

Figure 15:
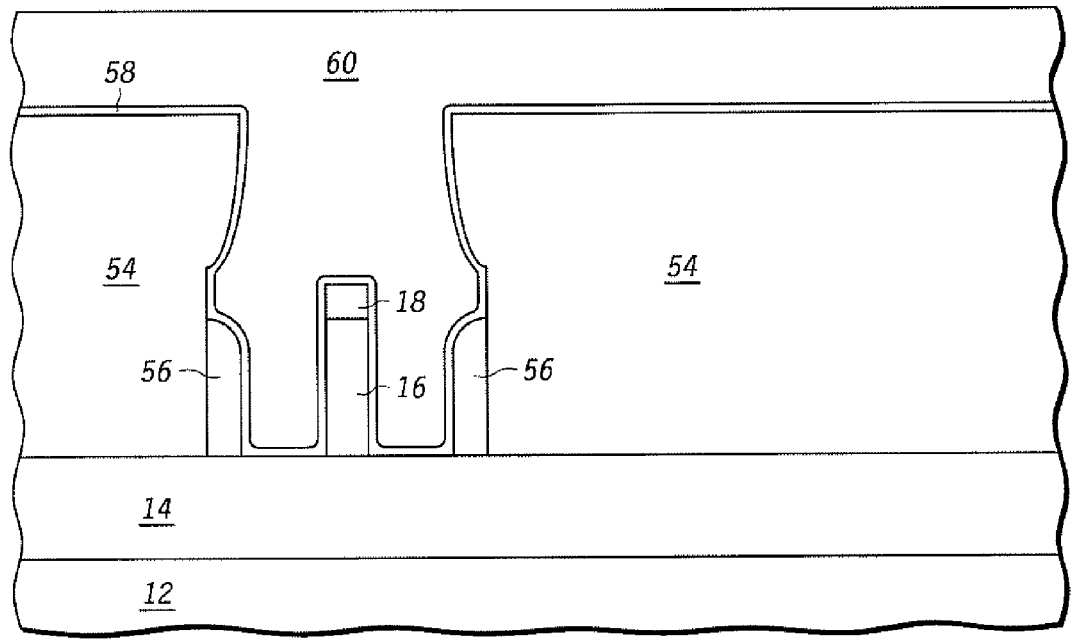

FIG. 15 illustrates formation of spacers 56 adjacent sidewalls of passivation layer 54. Spacers 56 are analogous to spacers 28 discussed above and can be formed using the same methods and materials discussed above with respect to spacers 28. For example, an anisotropic etch of a spacer layer can be used to form spacers 56, where spacers 56 may include a dielectric material, such as an oxide. As with passivation layer 20, passivation layer 54 has a greater height than fin 16, allowing for the formation of spacers 56 on sidewalls of passivation layer 54 without the formation of spacers adjacent sidewalls of fin 16. Also, note that a height of passivation layer 54 is greater than a height of spacers 56. (As discussed above with respect to spacers 30 and 28, note that spacers 56 appear to include separate portions due to the illustrated cross section; however, they may be portions of a single spacer. Therefore, spacers 56 may also be referred to as spacer 56.)

After formation of spacers 56, a gate dielectric layer 58 is formed over passivation layer 54, and over spacers 56, insulating layer 14, and fin 16 within opening 51. After formation of gate dielectric layer 58, a gate layer 60 is formed over gate dielectric layer 58. Gate dielectric layer 58 and gate layer 60 are analogous to gate dielectric layer 32, and gate layer 34, respectively, discussed above and can be formed using the same methods and materials discussed above with respect to gate dielectric layer 32 and gate layer 34.

Figure 16:
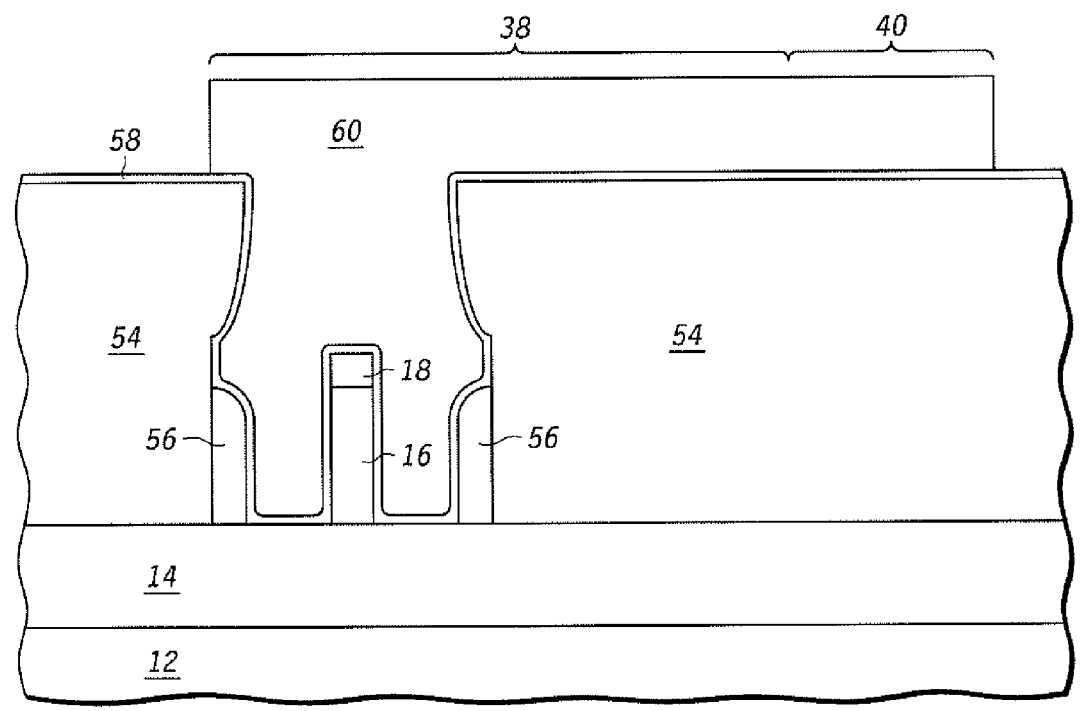

FIG. 16 illustrates device 10 after patterning and etching gate layer 60 to form gate electrode 38 and gate contact area 40. Note that, unlike gate 36 discussed above, resulting gate 60 is not substantially contiguous with a top of passivation layer 54, but instead extends over passivation layer 54 to form the remaining portion of gate electrode 38 and gate contact area 40. Therefore, note that gate 60 would appear as illustrated in FIG. 8. However, note that spacer 56 would only be located under a portion of gate electrode 38 rather than under all of gate electrode 38 and gate contact area 40, as illustrated in FIG. 8 with respect to spacer 28. Also, in the embodiments of FIGS. 1-7, note that the portion of the gate extending from fin 16 through gate contact area 40 lies over insulating layer 14 where passivation layer 20 is not located between gate 34 and insulating layer 14. However, note that in the embodiments of FIGS. 11-16, passivation layer 54 is not subsequently removed and a portion of gate electrode 38 and gate contact area 40 are formed over passivation layer 54. As in the case with the embodiments of FIGS. 1-7, spacer 56 may allow for reduced gate length dimensions and improved mechanical stability.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "plurality", as used herein, is defined as two or more than two. The term another, as used herein, is defined as at least a second or more.

The term "coupled", as used herein, is defined as connected, although not necessarily directly, and not necessarily mechanically.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described.

Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of forming a semiconductor device, the method comprising:
    providing a semiconductor layer;
    forming a passivation layer over the semiconductor layer, wherein the passivation layer has an opening having sidewalls;
    forming a fin over the semiconductor layer, wherein after forming the passivation layer the fin is within the opening;
    forming a portion of a gate within the opening; and
    forming spacers along the sidewalls of the opening.

2. The method of claim 1 wherein the fin is formed before forming the passivation layer.

3. The method of claim 1, further comprising forming a dummy gate over the fin; and removing the dummy gate before forming the spacers; and wherein forming the gate is performed after removing the dummy gate.

4. The method of claim 3, wherein forming the gate further comprises forming a gate electrode and a gate contact area and forming dummy gate further comprises forming a dummy structure for the gate electrode.

5. The method of claim 1, wherein forming the spacers further comprises:
    depositing a dielectric layer within the opening and over the fin; and
    anisotropically etching the dielectric layer to remove all portions of the dielectric layer except some portions that are adjacent the passivation layer to form the spacers, wherein the spacers have a first height and the opening of the passivation layer as a second height, wherein the first height is less than the second height.

6. The method of claim 5, further comprising:
    providing a buried oxide layer over the semiconductor layer;
    forming a capping layer over the fin;
    forming a gate dielectric layer within the opening and over the fin, and wherein:
        the forming the fin further comprising forming the fin over the buried oxide layer; and
        the forming the gate further comprising forming the gate over the gate dielectric layer.

7. The method of claim 1, wherein forming the passivation layer further comprises:
    depositing a passivation layer;
    forming a masking layer over the passivation layer, wherein the masking layer has a pattern; and
    etching the passivation layer using the masking layer to form the opening in the passivation layer.

8. The method of claim 1, wherein forming a portion of the gate within the opening further comprises:
    forming the portion of the gate so that the portion of the gate has a top portion and a bottom portion, wherein:
        the top portion is substantially contiguous with a top of the passivation layer and has a first dimension;
        the bottom portion is adjacent the spacers and has a second dimension between the spacers;
        the second dimension is parallel to the first dimension; and
        the first dimension is greater than the second dimension.

9. The method of claim 1, wherein:
    forming the fin further comprising forming the fin with a first height; and
    forming the passivation layer further comprises forming the passivation layer with a second height, wherein the second height is greater than the first height.

10. A method of forming a semiconductor device, comprising:
    forming a semiconductor layer;

forming a passivation layer over the semiconductor layer, wherein the passivation layer has an opening and wherein the opening has sidewalls;

forming a fin over the semiconductor layer, wherein after forming the passivation layer the fin is within the opening of the passivation layer;

forming a spacer adjacent the sidewalls of the opening of the passivation; and forming a gate, wherein a portion of the gate is within the opening of the passivation layer.

11. The method of claim 10, wherein the fin is formed before forming the passivation layer.

12. The method of claim 10, wherein forming the gate further comprises forming a gate electrode and a gate contact area.

13. The method of claim 10, wherein forming the spacer further comprises:

depositing a dielectric layer within the opening of the passivation layer and over the fin; and anisotropically etching the dielectric layer to remove at least portions of the dielectric layer that are over the fin and at least portions of the dielectric layer that are adjacent the fin to form the spacer along the sidewalls of the opening of the passivation layer.

14. The method of claim 10, further comprising forming a dummy gate over the fin; and removing the dummy gate before forming the spacer; and wherein the forming the gate is performed after removing the dummy gate.

15. The method of claim 10, wherein the forming the passivation layer further comprises:

depositing a passivation layer;

forming a masking layer over the passivation layer, wherein the masking layer has a pattern; and etching the passivation layer using the masking layer to form the opening of the passivation layer.

* * * * *